(12) United States Patent
Lee et al.

(10) Patent No.: US 6,396,695 B1
(45) Date of Patent: May 28, 2002

(54) CLIP FOR HEAT SINK

(75) Inventors: Hsieh Kun Lee, Chung-Ho (TW); Dongyun Lee, ShenZhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 34 days.

(21) Appl. No.: 09/686,437

(22) Filed: Oct. 10, 2000

(30) Foreign Application Priority Data

Jul. 28, 2000 (TW) ........................................ 89213118 4

(51) Int. Cl.$^7$ ................................................ H05K 7/20
(52) U.S. Cl. ...................................................... 361/704
(58) Field of Search ............................... 361/702–712, 361/714–723, 760, 783, 807, 816, 683, 687–690, 832; 257/706–727, 659–662, 691, 778, 625; 174/16.3, 35 R, 35 GC, 51, 200; 165/80.2, 80.3, 80.4, 165, 185; 24/570, 573.1, 533–534, 598.1, 458, 598.2, 459, 625; 248/316.7, 500–510

(56) References Cited

U.S. PATENT DOCUMENTS

| | | | | |
|---|---|---|---|---|
| 5,304,735 A | * | 4/1994 | Earl et al. ................... | 174/16.3 |
| 5,436,798 A | * | 7/1995 | Wieland ...................... | 361/710 |
| 5,889,653 A | * | 3/1999 | Clemens et al. ............. | 361/704 |
| 6,205,026 B1 | * | 3/2001 | Wong et al. ................. | 361/704 |
| 6,226,185 B1 | * | 5/2001 | Lin ............................. | 361/704 |
| 6,243,265 B1 | * | 6/2001 | Wong et al. ................. | 361/704 |

FOREIGN PATENT DOCUMENTS

JP          402298053 A  *  12/1990  ........... H01L/23/40

* cited by examiner

Primary Examiner—Darren Schuberg
Assistant Examiner—Michael Datskovsky
(74) Attorney, Agent, or Firm—Wei Te Chung

(57) ABSTRACT

A clip (10) for securing a heat sink (30) to an electronic device (40) includes a base (12), a pair of handles (16) and a pressing portion (18). The handles extend outwardly from opposite ends of the base. The base defines a slot (14) for receiving a catch (62) of a retention module (60). The slot includes first and second portion (142, 146) and a neck portion (144) therebetween. Upper limits of all three portions are colinear. The first portion has a vertical width greater than that of the second portion. A triangular protrusion (13) at the neck portion renders the vertical width of he neck portion less than that of both the first and second portions. The pressing portion extends inwardly from a top edge of the base. A pair of resilient tabs (242) depends from the pressing portion, for abutting a groove (36) of the heat sink. The catch is initially received in the first portion of the slot, and then moved over the triangular protrusion to the second portion. The tabs are thereby elastically deformed, and the heat sink is secured to the electronic device.

16 Claims, 4 Drawing Sheets

CLIP FOR HEAT SINK

BACKGROUND OF THE INVENTION

1. Field of the Invention

The present invention relates to a clip, and more particularly to a clip for securely and readily attaching a heat sink to an electronic device.

2. The Related Art

Many electronic devices generate a lot of heat during normal operation. The heat must be quickly removed to avoid instability or damage being caused to the device. Generally, a heat sink is mounted on a top surface of the electronic device, for removing heat therefrom. Various clips are used to mount the heat sink to the electronic device.

A conventional clip includes a pressing portion, and a pair of legs depending from respective opposite ends of the pressing portion. Each leg defines an aperture for engaging with a corresponding catch formed on a socket on which the electronic device is supported, whereby the heat sink is attached to the top surface of the electronic device.

However, this type of the clip has some disadvantages. For example, it requires the use of a tool during the assembly and disassembly procedures. This is inconvenient for users.

Furthermore, heat sinks these days are being made larger and larger. As a result, conventional clips are being made longer and longer. Long clips are prone to deformation during installation of the heat sink or subsequent operation of the electronic device. Thus large heat sinks in particular can not be securely fastened by conventional clips.

Another conventional means of mounting a heat sink to an electronic device utilizes a pair of clips attached on respective opposite sides of a heat sink. However, the pressing point of the clip, which acts on the heat sink, usually does not coincide with the center of the clip. Therefore, an eccentric moment can occur between the pressing point and the center of the clip. This may cause the heat sink to be dislodged from the electronic device when the system is subjected to shock or vibration during normal operation.

Examples of conventional clips are disclosed in U.S. Pat. Nos. 5,600,540 and 5,602,719, and Taiwan Patents Nos. 268622, 246982 and 303949.

SUMMARY OF THE INVENTION

Accordingly, an object of the present invention is to provide a clip for readily and securely attaching a heat sink to an electronic device.

To achieve the above object, a clip for securing a heat sink to an electronic device includes a vertical base, a pair of vertical handles and a horizontal pressing portion. The handles extend outwardly from opposite ends of the base. The base defines a slot for receiving a catch of a retention module. The slot includes first and second portions, and a neck portion therebetween. Upper limits of all three portions are colinear. The first portion has a vertical width greater than that of the second portion. A triangular protrusion is formed in the base at the neck portion, such that the vertical width of the neck portion is less than that of both the first portion and the second portion. The pressing portion extends inwardly from a top edge of the base. A pair of resilient tabs depends from the pressing portion, for abutting against a groove of a heat sink. The catch is initially received in the first portion of the slot, and then slidably moved over the triangular protrusion to be received in the second portion. Due to the difference invertical widths of the first and second portions, the tabs are thereby elastically deformed. Thus the heat sink is firmly pressed and secured to the electronic device.

Other objects, advantages and novel features of the present invention will be drawn from the following detailed embodiment of the present invention with attached drawings, in which:

DESCRIPTION OF THE PREFERRED EMBODIMENT

Figure 1:
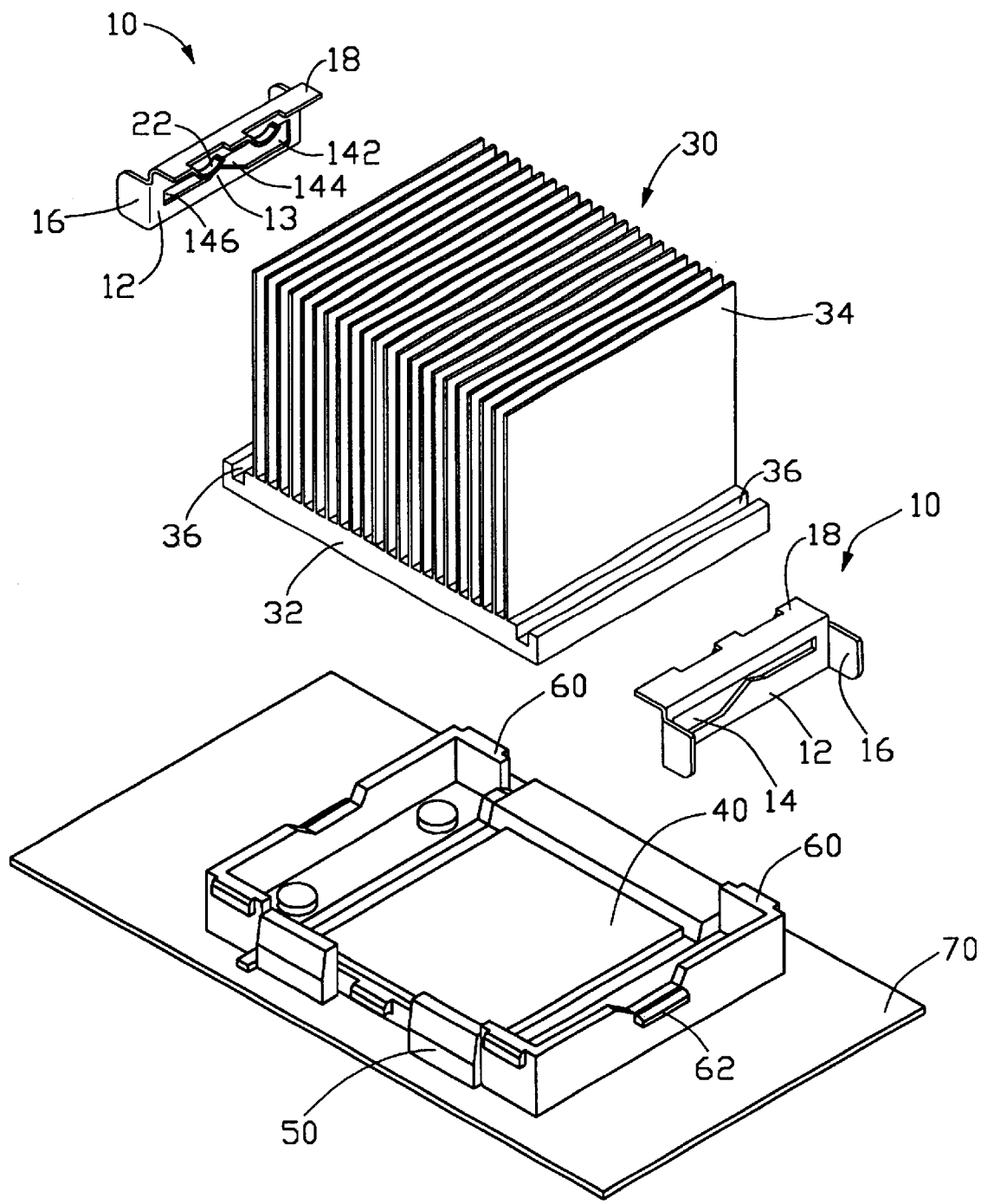
FIG. 1 is an exploded view of a pair of clips in accordance with the present invention, for securing a heat sink to an electronic device.

Referring to FIG. 1, a heat sink 30 includes a chassis 32, a pair of grooves 36 defined in an upper surface of the chassis 32, and a plurality of fins 34 extending upwardly from the upper surface of the chassis 32 between the grooves 36. An electronic device 40 and a pair of U-shaped retention modules 60 are mounted on a printed circuit board 70. The retention modules 60 are disposed on respective opposite sides of the electronic device 40, to define a space (not labeled) for receiving the heat sink 30 therein. Each retention module 60 forms an identical catch 62 on an outer sidewall thereof.

Figure 2:
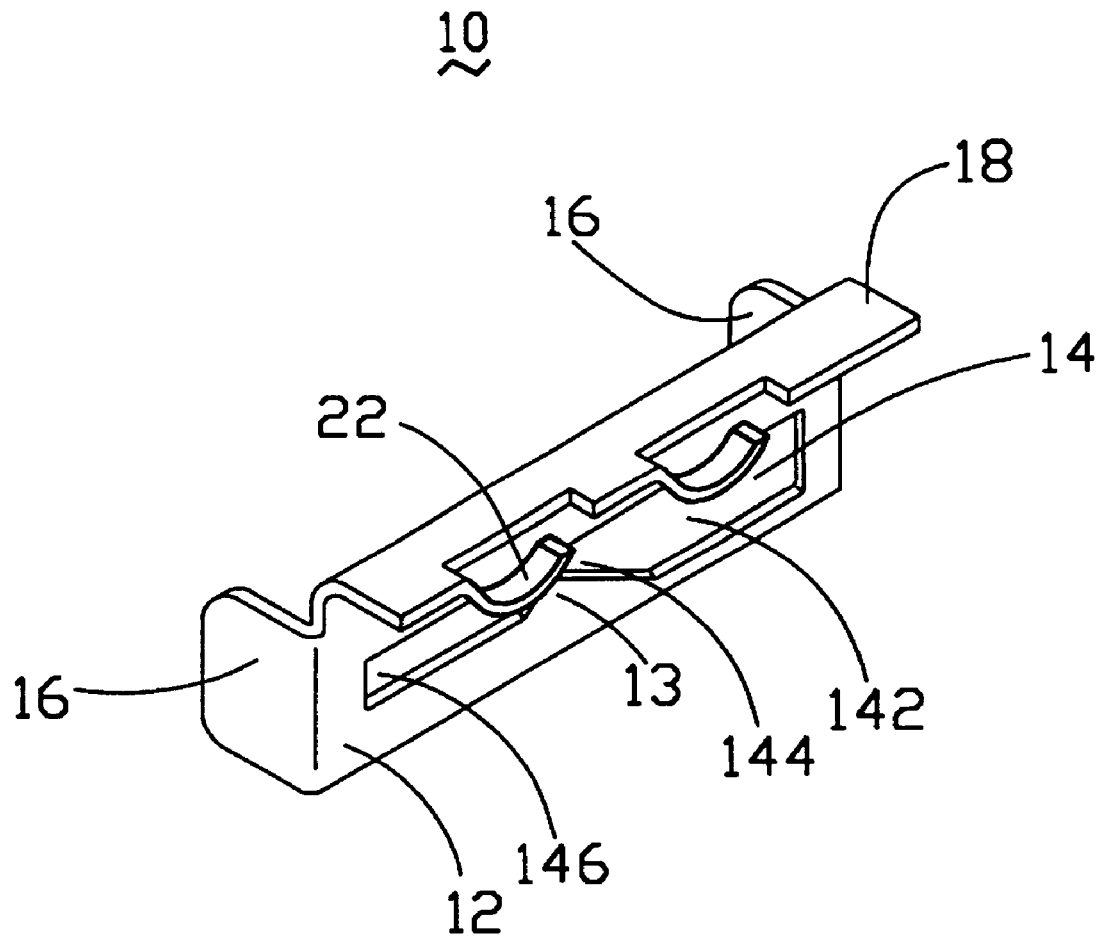
FIG. 2 is a perspective view of one clip of FIG. 1.

Referring also to FIG. 2, a clip 10 of the present invention is formed from a single plate. The clip 10 includes a vertical base 12, a vertical pair of handles 16, and a horizontal pressing portion 18. The handles 16 extend perpendicularly outwardly from respective opposite ends of the base 12. The pressing portion 18 extends perpendicularly inwardly from a top edge of the base.

The base 12 defines a slot 14 in a central portion thereof. The slot 14 includes a first portion 142, a second potion 146, and a neck portion 144 between the first portion 142 and the second portion 146. Upper limits of the first portion 142, neck portion 144, and the second portion 146 are colinear. A lower limit of the first portion 142 is lower than a lower limit of the second portion 146. Thus the first portion 142has a vertical width greater than that of the second portion 146. The base 12 forms a triangular protrusion 13 at a lower limit of the neck portion 144, thereby rendering the minimum vertical width of the neck portion 144 less than the vertical width of both the first portion 142 and the second portion 146. The first portion 142 and the second portion 146 are each dimensioned to correspond to the horizontal width of the catch 62 of the retention module 60.

A pair of tabs 22 is stamped downwardly at an inner edge of each pressing portion 18. The tabs 22 are generally arcuate for resiliency and are dimensioned to be received in the groove 36 of the heat sink 30.

Figure 3:
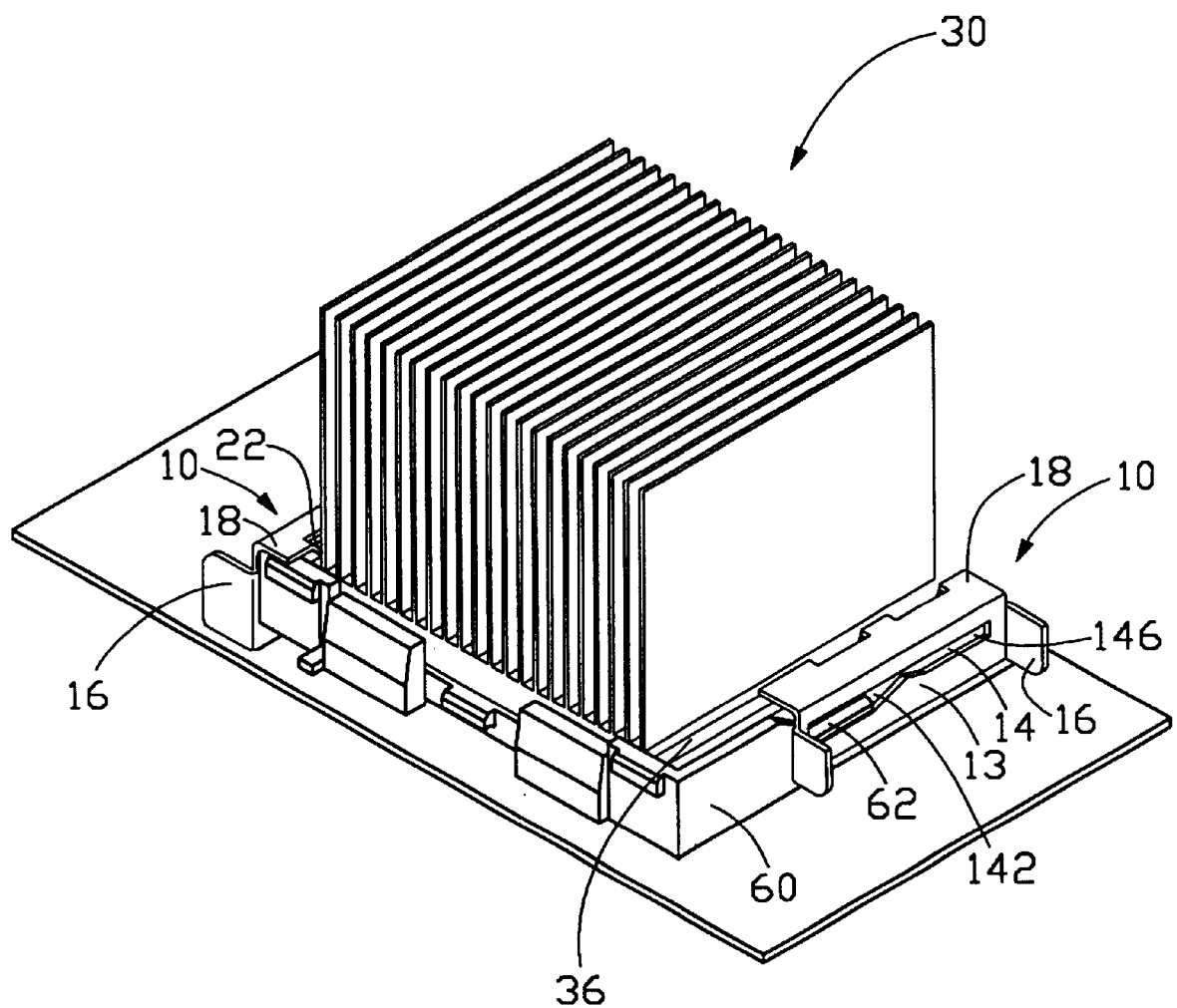
FIG. 3 is a partly assembled view of FIG. 1, showing a catch of a retention module received in a first portion of a slot defined in the clip.

Referring also to FIG. 3, in assembly, the heat sink 30 is placed on a top surface of the electronic device 40. The clips 10 are placed on the respective retention modules 60. The catch 62 of each retention module 60 is initially received in the first portion 142 of the slot 14 of the corresponding clip 10. The tabs 22 of the each clip 10 are received in the corresponding groove 36 of the heat sink 30.

Figure 4:
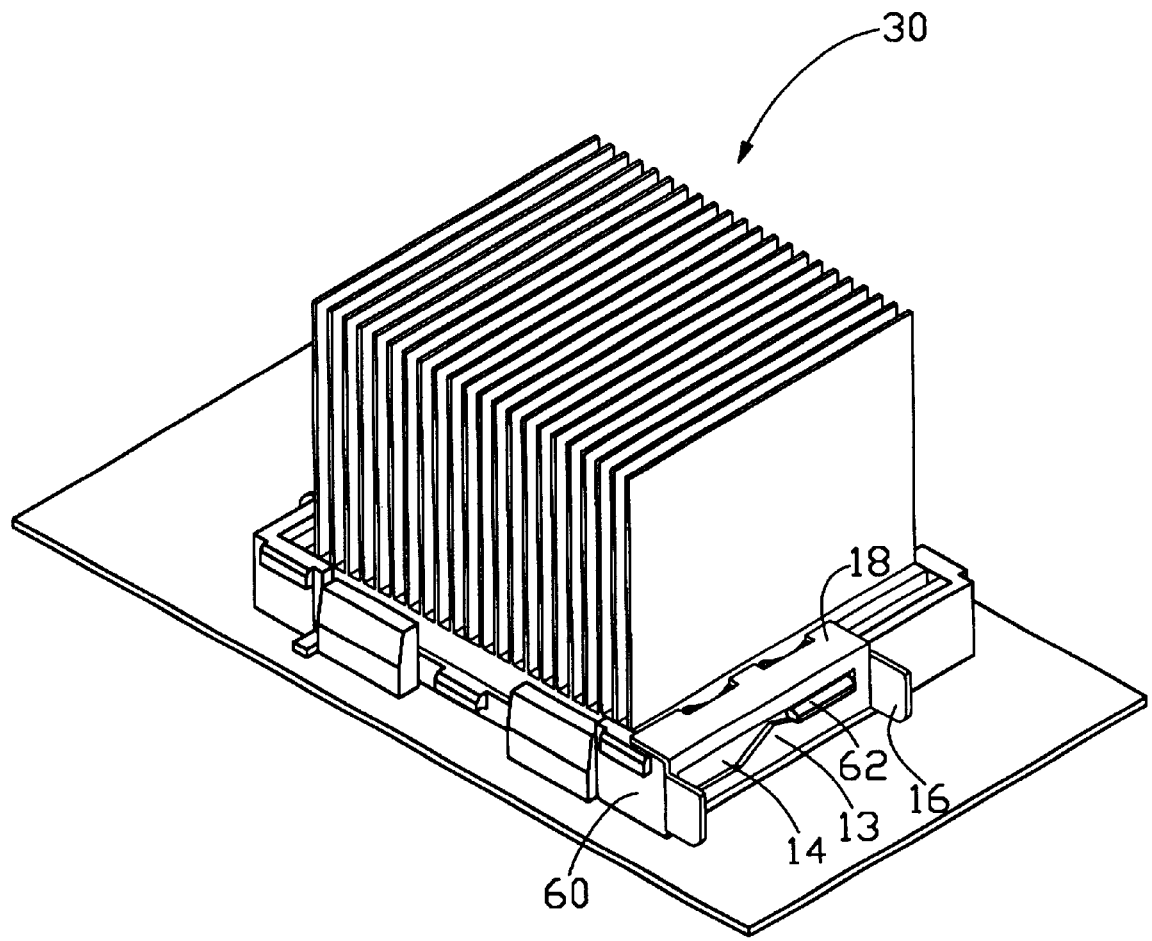
FIG. 4 is a fully assembled view of FIG. 1, showing the catch of the retention module received in a second portion of the slot defined in the clip.

Referring also to FIG. 4, the outermost handle 16 of each clip 10 is then pushed inwardly, such that the catch 62 of the retention module 60 slides over the triangular protrusion 13 of the slot 14 and proceeds to be retained in the second portion 146. Because the vertical width of the second portion 146 is less than that of the first portion 142, the catch 62 now exerts force on the clip 10 such that the tabs 22 of the clip 10 elastically deform. The tabs 22 thereby resiliently abut a bottom surface of the groove 36 of the heat sink 30.

Thus the clips 10 firmly press the heat sink 30 onto the electronic device 40. The triangular protrusion 13 of each clip 10 in cooperation with the resilient abuttal of the tabs 22 against a bottom surface of the groove 36 of the heat sink 30 operate to firmly retain the catch 62 of the retention module 60 in the second portion 146 of the slot 14. Thus the heat sink 30 is firmly and readily secured to the electronic device 40.

In disassembly, each clip 10 is disengaged from the catch 62 of the retention module 60. The now outermost handle 16 of each clip 10 is pushed inwardly such that the catch 62 of the retention module 60 slides over the triangular protrusion 13 of the slot 14 and proceeds to be retained in the first portion 142. Because the vertical width of the first portion 142 is greater than that of the second portion 146, the catch 62 now no longer exerts force on the clip 10. Thus the tabs 22 of the clip 10 elastically deformand return to their original state. The clips 10 are then easily removed from the retention module 60, and the heat sink 30 is readily detached from the electronic device 40.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip adapted for securing a heat sink to an electronic device mounted between a pair of retention modules comprising:
    a base defining a slot adapted to receive a catch formed on the retention module, the slot comprising a first portion, a second portion and a neck portion between the first portion and the second portion; and
    a pressing portion extending from the base and adapted for pressing the heat sink onto the electronic device;
    wherein the first portion is adapted to initially receive the catch of the retention module, the neck portion is adapted to facilitate movement of the catch from the first portion to the second portion, and the second portion is adapted to subsequently receive the catch such that the pressing portion thereby acts on the heat sink and pushes the heat sink toward the electronic device.

2. The clip as claimed in claim 1, wherein the first portion of the slot has a width greater than that of the second portion of the slot, and wherein the width of the neck portion of the slotis less than that of both the first and second portions.

3. The clip as claimed in claim 2, wherein upper limits of any two of the first portion, second portion and neck portion are colinear.

4. The clip as claimed in claim 2, wherein upper limits of the first portion, second portion and neck portion are colinear.

5. The clip as claimed in claim 2, wherein the base of the clip forms a triangular protrusion at the neck portion of the slot, thereby rendering the width of the neck portion less than that of both the first and second portions.

6. The clip as claimed in claim 1, whereby the neck portion is adapted to firmly retain the catch of the retention module in the second portion of the slot of the clip.

7. The clip as claimed in claim 1, wherein the base of the clip forms a triangular protrusion at the neck portion of the slot, the triangular protrusion being adapted to firmly retain the catch of the retention module in the second portion of the slot of the clip.

8. The clip as claimed in claim 1, wherein at least a tab extends from the pressing portion of the clip, each tab being adapted for pressingly engaging with at least a groove defined in the heat sink.

9. The clip as claimed in claim 1, wherein the clip further comprises at least a handle extending from at least one of opposite ends of the base, for facilitating manual operation of the clip.

10. A heat sink assembly comprising:
    a socket;
    an electronic device positioned on the socket;
    at least one retention module positioned at one end of said socket, said retention module defining a confinement region with a catch on a side thereof;
    a heat sink positioned on the electronic device and restrained in said confinement region along a direction parallel to said side; and
    a clip including a base defining a slot to receive the catch therein, and a pressing portion positioned on the heat sink; wherein
        said clip is moveable with regard to both the heat sink and the retention module along said direction to have the clip either loosely engaged with the heat sink for easy installation or tightly engaged with or firmly abutting against the heat sink for securement between the heat sink and the retention module.

11. The assembly as described in claim 10, wherein said slot defines a wider portion and a narrow portion in said direction, and the clip loosely engages the heat sink when the wider portion receives the catch while the clip tightly engages the heat sink when the narrow portion receives the catch.

12. The assembly as described in claim 11, wherein a neck portion is positioned between said narrow portion and said wide portion for locking the clip in position with regard to both the heat sink and the retention module along said direction.

13. The assembly as described in claim 11, wherein the lengthwise dimension of the narrow portion is compliant with a length dimension of the catch along said direction.

14. The assembly as described in claim 10, wherein at least one handle extends from the base opposite to said pressing portion.

15. The assembly as described in claim 10, wherein there are two retention modules and two associated clips at two opposite ends of the socket.

16. A heat sink assembly comprising:
    a socket;
    an electronic device positioned on the socket;
    at least one retention module positioned at one end of said socket, said retention module defining a confinement region;
    a heat sink positioned on the electronic device and restrained in said confinement region along a direction parallel to said side; and
    a clip including a base, a pressing portion positioned on the heat sink, and
    a handle extending from the base opposite to the pressing portion;
    means for latchably securing the clip and the retention module together;
    wherein
        said clip is operated by said handle to move with regard to both the heat sink and the retention module along said direction to a locking position for efficiently having the heat sink tightly sandwiched between the clip and electronic device.

* * * * *